(12) United States Patent
Kuo

(10) Patent No.: US 7,283,198 B2
(45) Date of Patent: Oct. 16, 2007

(54) RETICLE THERMAL DETECTOR

(75) Inventor: Yang-Kuao Kuo, Jhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 203 days.

(21) Appl. No.: 10/999,624

(22) Filed: Nov. 30, 2004

(65) Prior Publication Data

US 2006/0114432 A1 Jun. 1, 2006

(51) Int. Cl.
  *G03B 27/52* (2006.01)
  *G03B 27/42* (2006.01)
  *G03B 27/62* (2006.01)
  *G03C 5/00* (2006.01)

(52) U.S. Cl. ............... 355/30; 355/53; 355/75; 430/30

(58) Field of Classification Search .......... 355/30, 355/53, 67, 75, 77, 52; 430/5, 22, 30
See application file for complete search history.

(56) References Cited

U.S. PATENT DOCUMENTS

| 5,243,377 | A | * | 9/1993 | Umatate et al. | 355/53 |
| 5,581,324 | A | * | 12/1996 | Miyai et al. | 355/53 |
| 5,883,704 | A | * | 3/1999 | Nishi et al. | 355/67 |
| 5,959,721 | A | * | 9/1999 | Nishi | 355/53 |
| 6,040,096 | A | * | 3/2000 | Kakizaki et al. | 430/5 |
| 6,088,080 | A | * | 7/2000 | Itoh | 355/30 |
| 6,888,621 | B2 | * | 5/2005 | Araki et al. | 355/75 |
| 2004/0141164 | A1 | * | 7/2004 | Tsuji et al. | 355/30 |

* cited by examiner

*Primary Examiner*—Alan Mathews
(74) *Attorney, Agent, or Firm*—Tung & Associates

(57) ABSTRACT

A reticle thermal detector for measuring a thermal condition and distortion of a reticle prior to photolithography is disclosed. The reticle thermal detector includes a mechanism for determining a degree of distortion of the reticle. An alarm is connected to the mechanism for activation by the mechanism when the reticle is distorted. The invention further includes a novel method of enhancing the quality of circuit pattern images formed on a wafer during photolithography.

30 Claims, 3 Drawing Sheets

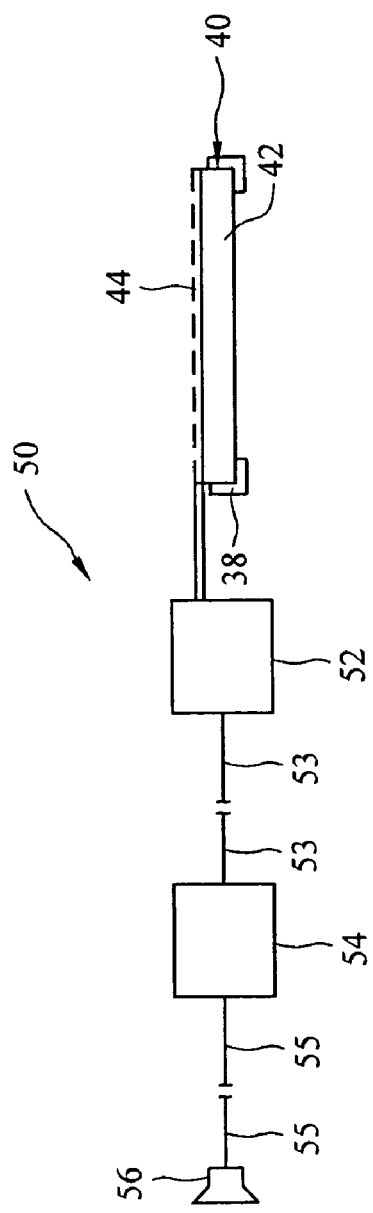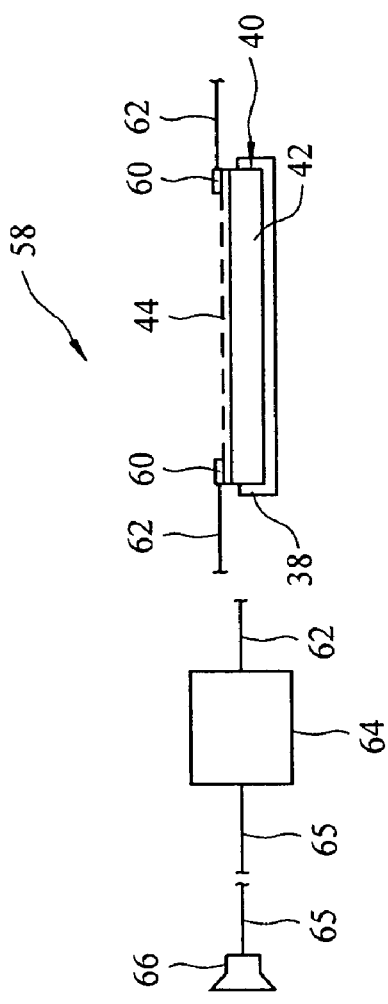

RETICLE THERMAL DETECTOR

FIELD OF THE INVENTION

The present invention relates to reticles used in the formation of integrated circuit (IC) patterns or dies on semiconductor wafer substrates. More particularly, the present invention relates to a thermal detector which determines whether a reticle is thermally distorted to an excessive degree prior to exposure of a wafer through the reticle in photolithography.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

During the photolithography step of semiconductor production, light energy is applied through a reticle mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

The circuit features on a reticle must be precisely fabricated since these features are transferred to the wafer to define the pattern of the circuits to be fabricated on the wafer. Thus, the quality of the reticle is important to produce high-quality imaging during submicron photolithography. If circuit pattern defects such as distortion and incorrect image placement on the reticle are not detected prior to the exposure step, these defects will be reproduced in the resist on the wafer. For this reason, once they are fabricated reticles are typically subjected to extensive automated testing for defects and particles.

Reticles are used in stepper systems and in step-and-scan systems, or scanners, which use a reduction lens to reduce overlay accuracy during circuit patterning. Steppers typically operate under a reduction ratio of 5:1 or 4:1, whereas scanners typically operate under a reduction ratio of 4:1. The small field exposure size on steppers and scanners facilitates precise control of tolerances during reticle alignment.

Steppers and scanners typically include a computer-controlled automatic alignment system which identifies alignment marks on the reticle. The reticle is mounted in a reticle stage and the wafer is supported on a wafer chuck provided on a wafer stage. An illumination system projects light through the alignment marks on the reticle and onto the wafer surface, respectively. Light detectors then optically detect the alignment marks on the reticle and marks on the wafer that are illuminated by the light. Laser infraredometry is used to measure the position of the wafer stage that holds the wafer chuck. Once obtained, the position data is fed into the system computer with a software interface to the electromechanical system used to facilitate the adjustments needed to properly align the wafer to the reticle.

Patterning of the circuit pattern on the photoresist is one of the main factors that dictates product success or failure, and a number of factors can contribute to pattern instability. It has been found that a major source of pattern instability is heat from the light source in the stepper or scanner. This heat raises the temperature of the reticle on the order of 4~6 degrees Celsius and causes the reticle to expand, thus distorting the circuit pattern in the reticle. Experiments have shown that continuous 10-hour exposure of a reticle (exposure dose=350 mJ/cm$^2$) in an I-line scanner causes the temperature of the reticle to rise from 22 degrees Celsius to 28 degrees Celsius. Furthermore, it has been shown that continuous 10 hour exposure of a reticle (exposure dose=70 mJ/cm$^2$) in a deep UV scanner to rise from 22 degrees Celsius to 26 degrees Celsius.

In further experiments, a wafer was coated with a DUV (deep ultraviolet) photoresist in a diamond-shaped pattern having a length-to-width ratio of 30:1. In one experiment, the reticle was placed in the wafer stage of a DUV scanner for 10 hours prior to exposure of the wafer through the reticle. It was found that the circuit pattern in the reticle was seriously deformed when transferred to the photoresist on the wafer. In another experiment, a reticle which had not been subjected to a 10 hour exposure to the light source in the scanner was placed in the wafer stage and then the wafer was exposed through the reticle. It was found that the pattern in the reticle, when transferred to the photoresist, was not distorted. Additional experiments carried out in an I-line scanner yielded similar results.

Accordingly, a reticle thermal detector is needed to determine whether a reticle is excessively distorted due to thermal effects prior to exposure of a wafer through the reticle, in order to prevent distorted circuit pattern images from being formed on wafers during photolithography.

An object of the present invention is to provide a novel reticle thermal detector which enhances the quality of circuit pattern images formed on semiconductor wafers.

Another object of the present invention is to provide a novel reticle thermal detector which ensures the integrity of a circuit pattern image prior to photolithographic transfer of the image from a reticle to a wafer.

Still another object of the present invention is to provide a novel reticle thermal detector which prevents distorted circuit pattern images from being transferred from a reticle to a wafer during photolithography.

Yet another object of the present invention is to provide a novel reticle thermal detector which enhances the yield of devices on a wafer.

A still further object of the present invention is to provide a novel reticle thermal detector which may use optical, mechanical or electromechanical means to measure thermal distortion of a reticle prior to exposure of a wafer through the reticle.

Another object of the present invention is to provide a novel reticle thermal detector which may be used in a stepper or scanner to ensure the integrity of circuit pattern images transferred from a reticle to a wafer.

Yet another object of the present invention is to provide a novel method of enhancing the quality of circuit pattern images formed on a wafer during photolithography.

Another object of the present invention is to provide an exposure apparatus which includes an exposure device such as a scanner or stepper and a reticle thermal detector provided in the exposure apparatus for determining whether a reticle is distorted prior to a photolithography process.

SUMMARY OF THE INVENTION

In accordance with these and other objects and advantages, the present invention is generally directed to a novel reticle thermal detector which is suitable for determining whether a reticle is distorted typically due to thermal effects prior to exposure of a semiconductor wafer through the reticle. In one embodiment, the optical reticle thermal detector includes a transmitter, a receiver spaced-apart from the transmitter, and an alarm connected to the receiver. The transmitter emits a light or infrared beam which is reflected from the surface of the reticle and into the receiver as a reflected beam. In the event that the reticle is not thermally distorted, the reflected beam enters the receiver and the alarm is not activated. In the event that the reticle is thermally distorted, on the other hand, the reflected beam is deflected from the reticle and does not enter the receiver. This causes the alarm to be activated, thus alerting personnel to the thermally distorted state of the reticle.

In another embodiment, a mechanical device is used to determine thermal distortion of the reticle. The mechanical device activates the alarm in the event that the reticle is distorted to a degree which is excessive for subsequent exposure of a semiconductor wafer through the reticle. In still another embodiment, an electromechanical device is used to determine thermal distortion of the reticle and activates the alarm in the event that the reticle is thermally distorted. The invention further includes a novel method of enhancing the quality of circuit pattern images formed on a wafer during photolithography.

In still another embodiment, the invention includes an exposure apparatus such as a scanner or stepper which includes a reticle thermal detector. The exposure apparatus includes an exposure device for exposing a wafer. The exposure device includes a light source for emitting light, a reticle stage adjacent to the light source for holding a reticle and a lens adjacent to the reticle stage. The reticle thermal detector includes a mechanism for determining a degree of distortion of the reticle provided adjacent to the reticle stage and an alarm connected to the mechanism for activation by the mechanism when the reticle is distorted.

BRIEF DESCRIPTION OF THE DRAWINGS

The invention will now be described, by way of example, with reference to the accompanying drawings, in which:

FIG. 4 is a schematic view of an illustrative embodiment of a mechanical reticle thermal detector according to the present invention; and FIG. 5 is a schematic view of an illustrative embodiment of an electromechanical reticle thermal detector according to the present invention.

DETAILED DESCRIPTION OF THE INVENTION

Figure 1:
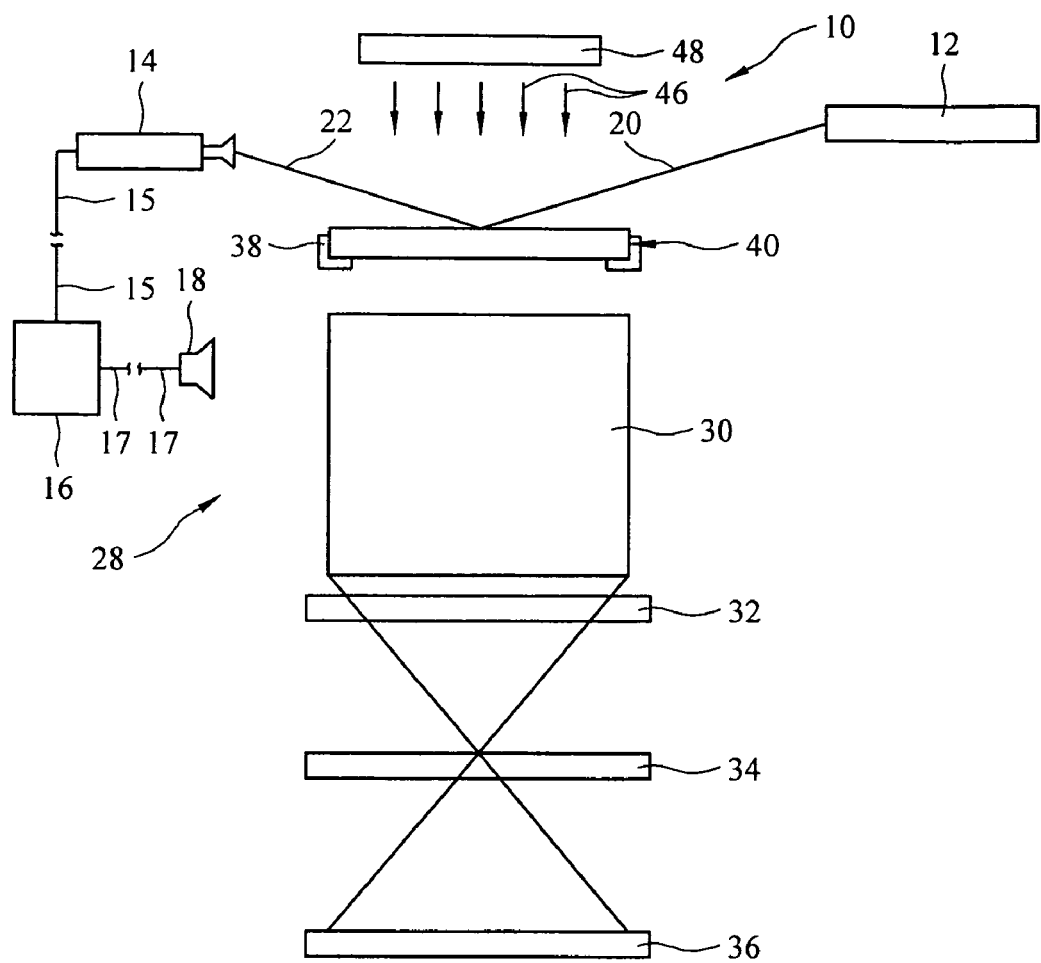
FIG. 1 is a schematic view of an illustrative embodiment of an optical reticle thermal detector according to the present invention, illustrating implementation of the invention when the reticle is in an undistorted condition.

The present invention contemplates a novel reticle thermal detector which is suitable for determining whether a reticle is distorted typically due to thermal effects from an exposure light source in a stepper or scanner prior to exposure of a semiconductor wafer through the reticle. The reticle thermal detector alerts personnel to the distorted condition of a reticle as the reticle lies on a reticle stage in a stepper or scanner preparatory to a photolithography process. Therefore, the distorted reticle can be removed and a replacement reticle placed on the reticle stage to ensure that a circuit pattern of high integrity is transmitted from the reticle to a wafer with precision during photolithography.

In one embodiment, the reticle thermal detector of the present invention is an optical reticle thermal detector and includes a transmitter such as a laser beam transmitter or a light-emitting diode, for example. A receiver is positioned in spaced-apart relationship with respect to the transmitter, with the transmitter and receiver located on opposite sides of a reticle stage in a stepper or scanner. An alarm connected to the receiver receives an activation signal from the receiver when the receiver fails to receive a beam reflected from the reticle. Prior to exposure of a wafer through a reticle placed on the reticle stage, the transmitter emits a light or infrared beam which is reflected from the surface of the reticle and into the receiver as catoptric energy. As long as the reticle is in an undistorted configuration, the beam is reflected from the reticle at such an angle that the reflected beam enters the receiver and the alarm is not activated. On the other hand, in the event that the reticle is thermally distorted, the distorted reticle deflects the reflected beam from entering the receiver. The receiver, in turn, activates the alarm and thereby alerts personnel to the thermally-distorted condition of the reticle.

In another embodiment, the reticle thermal detector includes a mechanical device which determines whether the reticle is thermally distorted through mechanical means. In the event that the reticle is distorted, the mechanical device activates the alarm. In still another embodiment, the reticle thermal detector includes an electromechanical device which determines whether the reticle is distorted and activates the alarm in the event that the reticle is distorted. The invention further includes a novel method of enhancing the quality of circuit pattern images formed on a wafer during photolithography by monitoring the distorted state or configuration of a reticle prior to use of the reticle in photolithography.

In still another embodiment, the invention includes an exposure apparatus such as a scanner or stepper which includes a reticle thermal detector. The exposure apparatus includes an exposure device for exposing a wafer. The exposure device includes a light source for emitting light, a reticle stage adjacent to the light source for holding a reticle and a lens adjacent to the reticle stage. The reticle thermal detector includes a mechanism for determining a degree of distortion of the reticle provided adjacent to the reticle stage and an alarm connected to the mechanism for activation by the mechanism when the reticle is distorted.

Figure 2:
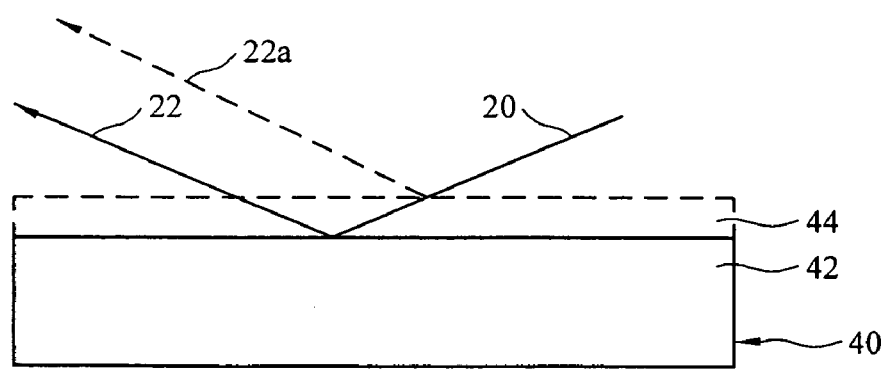
FIG. 2 is a schematic view of a reticle, illustrating reflection of light from the reticle when the reticle is in the undistorted condition (solid lines) and when the reticle is thermally distorted (dashed lines)
Figure 3:
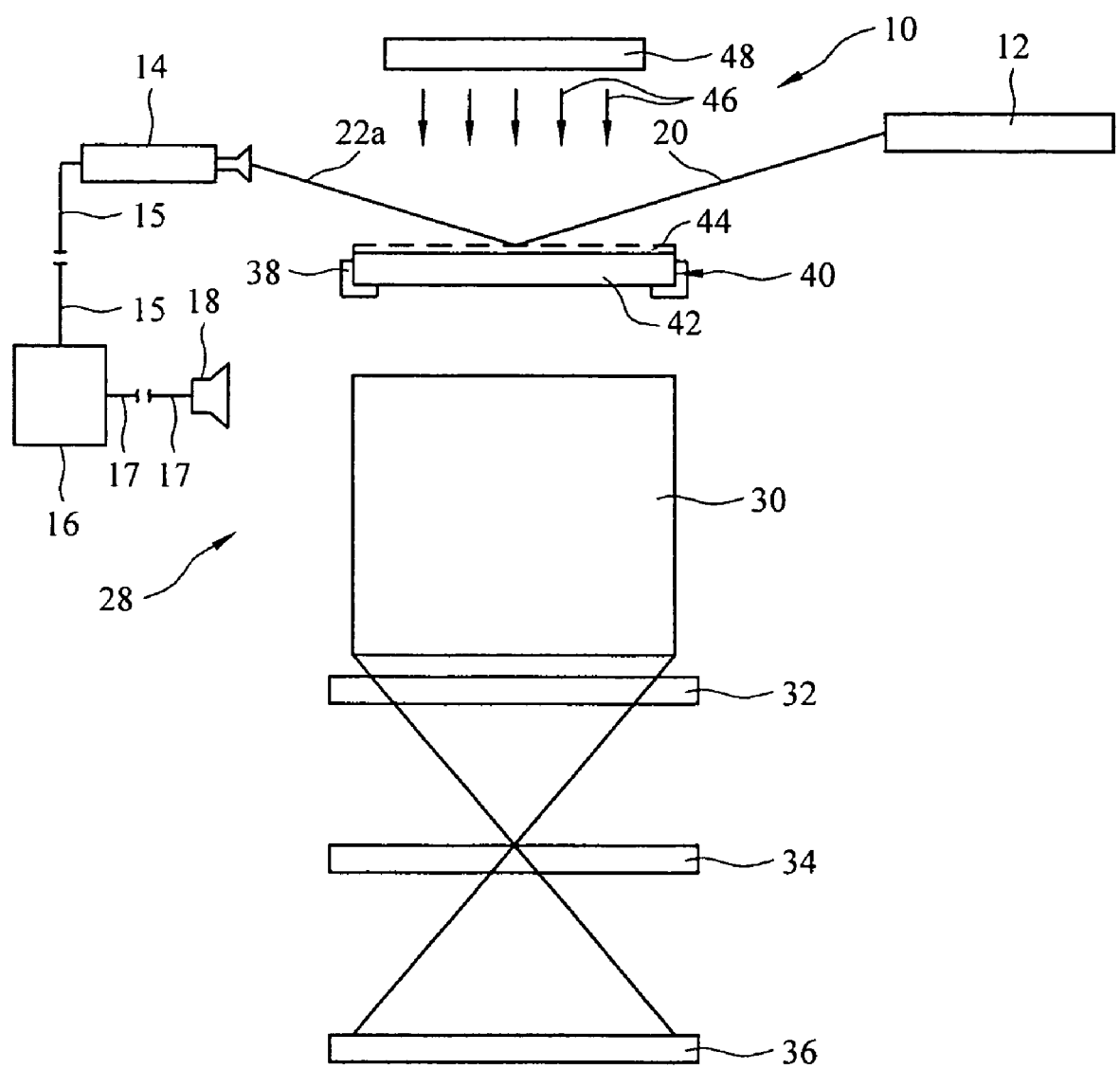
FIG. 3 is a schematic view of an illustrative embodiment of an optical reticle thermal detector according to the present invention, illustrating implementation of the invention when the reticle is in a thermally-distorted condition.

Referring initially to FIGS. 1-3, an illustrative embodiment of an optical reticle thermal detector of the present invention is generally indicated by reference numeral 10. The optical reticle thermal detector 10 is designed to be installed in a stepper or scanner 28 which may be conventional and is used to transmit circuit pattern images from a reticle 40 to a semiconductor wafer substrate (not shown) in the photolithography step of semiconductor fabrication. The stepper/scanner 28 includes a reticle stage 38 for holding the reticle 40; a lens 30 beneath the reticle stage 38; and a positive focal point 32, a center focal point 34 and a negative focal point 36 beneath the lens 30. A light source 48 is disposed above the reticle stage 38 for emitting light 46 through the reticle 40.

During photolithography, a semiconductor wafer (not shown) is placed on a wafer stage (not shown) at the center focal point 34. Light 46 is emitted from the light source 48 through the reticle 40 and lens 30, respectively. When the reticle 40 is in an undistorted configuration, the lens 30 focuses the circuit pattern image defined by the reticle 40 onto the wafer at the center focal point 34. This results in a circuit pattern of high integrity and quality being formed on the wafer.

On the other hand, throughout extended use, the light 46 from the light source 48 tends to heat the reticle 40, thus causing the reticle 40 to expand and become thermally distorted. This, in turn, causes the circuit pattern image to become focused above the center focal point 34 (toward the positive focal point 32) or below the center focal point 34 (toward the negative focal point 36). Consequently, the circuit pattern image transmitted to the wafer at the center focal point 34 becomes distorted, resulting in a distorted circuit pattern image of low quality being formed on the wafer.

The optical reticle thermal detector 10 of the present invention includes a transmitter 12 and a receiver 14 which are disposed in spaced-apart relationship with respect to each other on opposite sides of the reticle stage 38. A computer 16 is connected to the light receiver 14, typically through computer wiring 15. An alarm 18 is, in turn, connected to the computer 16 typically through alarm wiring 17. The transmitter 12 and receiver 14 are positioned in such a manner that an incident beam 20 emitted from the transmitter 12 is reflected from the reticle 40 as a reflected beam 22 which enters the receiver 14 as catoptric energy when the reticle 40 is in an undistorted configuration.

The transmitter 12 may be any light-emitting element known by those skilled in the art, including but not limited to a laser-emitting device or an LED (light-emitting diode), for example. Alternatively, the transmitter 14 may be any device which is suitable for emitting a beam of electromagnetic radiation such as infrared radiation, for example. The receiver 14 may be any device which is capable of receiving a reflected light or radiation beam and responsively transmitting an electrical signal to the computer 16 (or alternatively, transmitting a modulated electrical signal or terminating transmission of an electrical signal to the computer 16) in the event that the reflected light or radiation beam is no longer received by the receiver 14. The alarm 18 may be an audible alarm, a visual alarm, or both an audible and visual alarm. The computer 16 is programmed to activate the alarm 18 in the event that the receiver 14 transmits an electrical signal to the computer 16, transmits a modulated electrical signal to the computer 16 or terminates transmission of an electrical signal to the computer 16.

In operation of the optical reticle thermal detector 10, a reticle 40 is initially placed in the reticle stage 38 of the stepper/scanner 28, and a semiconductor wafer (not shown) having a photoresist layer deposited thereon is placed on a wafer stage (not shown) in the stepper/scanner 28. Under circumstances in which the reticle 40 is generally in thermal equilibrium with the environment (such as may occur, for example, upon initial placement of a previously unused reticle 40 in the reticle stage 38), the reticle 40 is in an undistorted condition, as illustrated by the area bounded by the solid lines and indicated by reference numeral 42 in FIG. 2. Therefore, the reticle 40 is suitable to transmit a circuit pattern image of high quality onto the wafer (not shown) placed on the wafer stage in the stepper/scanner 28 during a subsequent photolithography process. On the other hand, under circumstances in which the reticle 40 has been heated to an excessive degree, typically by the light 46 from the light source 48 (such as may occur throughout prolonged usage of the reticle 40 in the stepper/scanner 28), the reticle 40 is in an expanded, thermally-distorted configuration, as illustrated by the area bounded by the dashed lines and indicated by reference numeral 44 in FIG. 2. Therefore, the distorted reticle 40 is not suitable to transmit a high-quality circuit pattern image onto the wafer during a subsequent photolithography process.

Prior to the photolithography process, the thermal state of the reticle 40 is determined by the reticle thermal detector 10. Accordingly, an incident light or radiation beam 20 is emitted from the transmitter 12, typically against the upper surface of the reticle 40. FIG. 1 illustrates the case in which the reticle 40 is in an undistorted configuration. In that case, a reflected beam 22 is reflected from the reticle 40 and enters the receiver 14 as catoptric energy. As long as the reflected beam 22 enters the receiver 14, the receiver 14 does not transmit an electrical signal to the computer 16 through the computer wiring 15. Therefore, the computer 16 refrains from activating the alarm 18 through the alarm wiring 17 and the photolithography process can proceed.

During photolithography, light 46 is emitted from the light source 48 and through the reticle 40 and lens 30, respectively. The lens 30 focuses the light 46, in the form of the circuit pattern image in the reticle 40, onto the wafer (not shown) located at the center focal point 34. Due to the undistorted configuration of the reticle 40, the circuit pattern image transmitted to the wafer has a high resolution and facilitates the etching of high-quality circuits on the wafer during subsequent process steps.

In the event that the reticle 40 has been heated excessively (such as by the heat source 48 after prolonged use in the stepper/scanner 28, for example), the reticle 40 becomes thermally distorted. This is indicated by the dashed lines in FIG. 2, in which the enlarged area of the reticle 40 indicated by reference numeral 44 represents the increased size of the distorted reticle 40 relative to the normal, undistorted size (indicated by reference numeral 42). Consequently, as shown in FIG. 3, the distorted reticle 40 deflects the reflected light beam 22a away from entering the receiver 14. Therefore, the receiver 14 transmits an electrical signal to the computer 16, through the computer wiring 15. Responsive to the signal from the receiver 14, the computer 16 transmits an alarm activation signal to the alarm 18, through the alarm wiring 17. The alarm 18 broadcasts an audible signal, a visual signal or both an audible and a visual signal to alert personnel to the distorted condition of the reticle 40. Therefore, the reticle 40 can be removed from the reticle stage 38 and replaced with an undistorted reticle 40 to ensure transmittal of a high-quality circuit pattern image from the reticle 40 onto the semiconductor wafer.

In the configuration of the reticle thermal detector 10 heretofore described, the receiver 14 transmits an electrical signal to the computer 16 and the computer 16 activates the alarm 18 in the event that the reflected beam 22a does not enter the receiver 14. However, it is understood that alternative operational configurations are possible. For example, the receiver 14 may be adapted to transmit an electrical signal to the computer 16 under circumstances in which the reticle 40 is undistorted (and the reflected beam 22 therefore enters the receiver 14). In that case, the receiver 14 does not transmit the signal to the computer 16 and the computer 16 consequently activates the alarm 18 if the reflected beam 22 does not enter the receiver 14 (thus indicating that the reticle 40 is distorted). In another alternative configuration, when the reticle 40 is undistorted, the receiver 14 transmits a baseline signal to the computer 16 as long as the reflected beam 22 enters the receiver 14. If the reticle 40 is distorted, the receiver 14 transmits a modulated electrical signal to the computer 16, which activates the alarm 18 responsive to receiving the modulated signal from the receiver 14.

Referring next to FIG. 4, a mechanical retical thermal detector according to the present invention is generally indicated by reference numeral 50. The mechanical retical thermal detector 50 includes a mechanical device 52 which engages a reticle 40 when the reticle 40 rests on a reticle stage 38 of a stepper/scanner 28 (FIG. 1). A computer 54 is connected to the mechanical device 52 typically through computer wiring 53. An alarm 56, which may be an audible alarm, a visual alarm or both, is connected to the computer 54 typically through alarm wiring 55. The mechanical device 52 may be any device which is capable of detecting an abnormal thickness of the reticle 40 when the reticle 40 is in a thermally distorted configuration and transmitting an electrical signal (or alternatively, transmitting a modulated electrical signal or terminating transmission of the signal) to the computer 54 in the event that the reticle 40 is distorted. Accordingly, in the event that the reticle 40 is undistorted, the computer 54 does not activate the alarm 56. In the event that the reticle 40 is distorted, the mechanical device 52 causes the computer 54 to activate the alarm 56 by transmitting an electrical signal, transmitting a modified electrical signal or terminating transmission of an electrical signal to the computer 54. The reticle 40 can then be replaced by an undistorted reticle prior to photolithography.

Referring next to FIG. 5, an electromechanical retical thermal detector according to the present invention is generally indicated by reference numeral 58. The electromechanical retical thermal detector 58 includes at least one, and typically, multiple piezoelectric sensors 60 which engage a reticle 40 when the reticle 40 rests on a reticle stage 38 of a stepper/scanner 28 (FIG. 1). A computer 64 is connected to the piezoelectric sensors 60 typically through computer wiring 62. An alarm 66, which may be an audible alarm, a visual alarm or both, is connected to the computer 64 typically through alarm wiring 65. The piezoelectric sensors 60 are capable of sensing pressure exerted by the reticle 40 when the reticle 40 is in an expanded, thermally distorted configuration, in which case the piezoelectric sensors 60 generate and transmit an electrical signal to the computer 64 through the computer wiring 62. Consequently, the computer 64 activates the alarm 66 through the alarm wiring 65. In the event that it is undistorted, the reticle 40 does not exert pressure on the sensors 60. Consequently, the sensors 60 do not transmit an electrical signal to the computer 64 and the computer 64 does not activate the alarm 66.

While the preferred embodiments of the invention have been described above, it will be recognized and understood that modifications can be made in the invention and the appended claims are intended to cover all such modifications which may fall within the spirit and scope of the invention.

What is claimed is:

1. A reticle thermal detector for measuring a thermal condition of a reticle, comprising:
    a mechanism for sensing a maximum degree of acceptable distortion of the reticle; and
    an alarm connected to said mechanism for activation by said mechanism when the reticle is distorted beyond said maximum degree.

2. The reticle thermal detector of claim 1 wherein said mechanism comprises an optical mechanism.

3. The reticle thermal detector of claim 2 wherein said optical mechanism comprises a transmitter for emitting an incident beam against an upper surface of the reticle and a receiver spaced from said transmitter for receiving a reflected beam from the reticle, and wherein said alarm is connected to said receiver.

4. The reticle thermal detector of claim 1 wherein said mechanism comprises a mechanical device.

5. The reticle thermal detector of claim 1 wherein said mechanism comprises an electromechanical device.

6. The reticle thermal detector of claim 5 wherein said electromechanical device comprises at least one piezoelectric sensor for engaging the reticle and wherein said alarm is connected to said at least one piezoelectric sensor.

7. The reticle thermal detector of claim 1 wherein said alarm comprises an audible alarm.

8. The reticle thermal detector of claim 1 wherein said alarm comprises a visual alarm.

9. The reticle thermal detector of claim 4 wherein said mechanical device senses a change in thickness of said reticle.

10. The reticle thermal detector of claim 6 wherein said piezoelectric sensor engages an upper surface of the reticle.

11. A reticle thermal detector for measuring a thermal condition of a reticle comprising:
    a transmitter for transmitting an incident optical beam against an upper surface of the reticle;
    a receiver spaced-apart from said transmitter for receiving a reflected beam from the upper surface of the reticle;
    a computer connected to said receiver; and
    an alarm operably connected to said computer, said alarm adapted for activation by said computer when the reflected beam is deflected from said receiver.

12. The reticle thermal detector of claim 11 wherein said transmitter comprises a laser-emitting device.

13. The reticle thermal detector of claim 11 wherein said transmitter comprises a light-emitting diode.

14. The reticle thermal detector of claim 11 wherein said transmitter is adapted to transmit infrared radiation.

15. The reticle thermal detector of claim 11 wherein said alarm comprises an audible alarm.

16. The reticle thermal detector of claim 11 wherein said alarm comprises a visual alarm.

17. The reticle thermal detector of claim 11 wherein said alarm comprises an audible alarm and a visual alarm.

18. The reticle thermal detector of claim 11 further comprising an exposure device for exposing a wafer, said exposure device comprising a light source for emitting light, a reticle stage adjacent to said light source for holding said reticle and a lens adjacent to said reticle stage.

19. The exposure apparatus of claim 18 wherein said exposure device comprises a scanner.

20. The exposure apparatus of claim 18 wherein said exposure device comprises a stepper.

21. A reticle thermal detector for determining an unacceptable thermal expansion condition of a mounted reticle, comprising:
   a reticle mounted on a reticle stage of an exposure device for exposing a wafer;
   a transmitter positioned adjacent an upper surface of said reticle stage, said transmitter positioned to transmit an incident optical beam against said upper surface of the reticle;
   a receiver positioned on an opposite of said reticle stage adjacent said major surface, said receiver positioned to receive said optical beam reflected from the upper surface of the reticle;
   a computer connected to said receiver; and
   an alarm operably connected to said computer for activation by said computer when the reflected beam is deflected from said receiver.

22. The reticle thermal detector of claim 21 wherein said transmitter comprises a laser-emitting device to produce said optical beam.

23. The reticle thermal detector of claim 21 wherein said transmitter comprises a light-emitting diode to produce said optical beam.

24. The reticle thermal detector of claim 21 wherein said transmitter is adapted to transmit infrared radiation to produce said optical beam.

25. The reticle thermal detector of claim 21 wherein said alarm comprises an audible alarm.

26. The reticle thermal detector of claim 21 wherein said alarm comprises a visual alarm.

27. The reticle thermal detector of claim 21 wherein said alarm comprises an audible alarm and a visual alarm.

28. The reticle thermal detector of claim 21 wherein said exposure device comprises a light source for emitting light, said reticle stage adjacent to said light source and a lens adjacent to said reticle stage.

29. The exposure apparatus of claim 21 wherein said exposure device comprises a scanner.

30. The exposure apparatus of claim 21 wherein said exposure device comprises a stepper.

* * * * *